(12) United States Patent
Willig-Onwuachi et al.

(10) Patent No.: US 6,791,321 B2
(45) Date of Patent: Sep. 14, 2004

(54) BIRDCAGE COILS FOR SIMULTANEOUS ACQUISITION OF SPATIAL HARMONICS

(75) Inventors: Jacob D. Willig-Onwuachi, Brookline, MA (US); Robert W. Brown, Solon, OH (US); Shmaryu M. Shvartsman, Highland Heights, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 120 days.

(21) Appl. No.: 10/173,933

(22) Filed: Jun. 18, 2002

(65) Prior Publication Data

US 2003/0231018 A1 Dec. 18, 2003

(51) Int. Cl.[7] .................................................. G01V 3/00
(52) U.S. Cl. ........................ 324/309; 324/307; 324/318
(58) Field of Search ................................ 324/300, 307, 324/309, 318, 909, 322; 600/410, 422, 425

(56) References Cited

U.S. PATENT DOCUMENTS

| | | | |
|---|---|---|---|
| 4,680,548 A | | 7/1987 | Edelstein et al. ............ 324/318 |
| 5,374,890 A | * | 12/1994 | Zou et al. .................... 324/318 |
| 5,412,322 A | * | 5/1995 | Wollin ......................... 324/318 |
| 5,543,711 A | * | 8/1996 | Srinivasan et al. .......... 324/318 |
| 5,602,479 A | * | 2/1997 | Srinivasan et al. .......... 324/318 |
| 5,898,306 A | * | 4/1999 | Liu et al. ..................... 324/318 |
| 5,910,728 A | | 6/1999 | Sodickson ................... 324/309 |
| 5,990,681 A | * | 11/1999 | Richard et al. .............. 324/318 |
| 5,998,999 A | * | 12/1999 | Richard et al. .............. 324/318 |
| 6,029,082 A | * | 2/2000 | Srinivasan et al. .......... 600/422 |
| 6,043,658 A | | 3/2000 | Leussler ...................... 324/318 |
| 6,100,694 A | * | 8/2000 | Wong .......................... 324/318 |
| 6,198,288 B1 | * | 3/2001 | Gauss et al. ................. 324/322 |
| 6,211,677 B1 | * | 4/2001 | Burl et al. ................... 324/322 |
| 6,316,941 B1 | * | 11/2001 | Fujita et al. ................. 324/318 |
| 6,377,044 B1 | * | 4/2002 | Burl et al. ................... 324/307 |
| 6,396,271 B1 | * | 5/2002 | Burl et al. ................... 324/318 |
| 6,404,199 B1 | * | 6/2002 | Fujita et al. ................. 324/318 |
| 6,420,871 B1 | * | 7/2002 | Wong et al. ................. 324/318 |
| 6,477,399 B2 | * | 11/2002 | Biswal et al. ............... 600/410 |
| 6,522,143 B1 | * | 2/2003 | Fujita et al. ................. 324/318 |
| 6,591,128 B1 | * | 7/2003 | Wu et al. ..................... 600/422 |

OTHER PUBLICATIONS

Hayes, et al., "An Efficient, Highly Homogeneous Radiofrequency Coil for Whole–Body NMR Imaging at 1.5 T", Journ. of Magn. Resonance, 63, 622–628 (1985).

Sodickson, et al., "Simultaneous Acquisition of Spatial Harmonics (SMASH) : Fast Imaging with Radiofrequency Coil Arrays", MRM 38:591–603 (1997).

Jakob, et al., "Auto–Smash: A self–Calibrating Technique for SMASH Imaging", Magnetic Resonance Materials in Physics, Biology & Medicine 7 (1998) 42–54.

Leussler, et al., "The Bandpass Birdcage Resonator Modified as a Coil Array For Simultaneous MR Acquisition", 1997.

McKenzie, et al., "Optimisation of SMASH Image Reconstructions For Robust In Vivo Imaging", Proceed. of ISMRM—8th Meeting, Apr. 1, 2000.

* cited by examiner

Primary Examiner—Diego Gutierrez
Assistant Examiner—Dixomara Vargas
(74) Attorney, Agent, or Firm—Fay, Sharpe, Fagan, Minnich & McKee, LLP

(57) ABSTRACT

In a magnetic resonance imaging apparatus, a main magnet assembly (12) produces a uniform magnetic field through an imaging region (14). An imaging region is defined within a subject by selecting gradient magnetic fields spatially encode the main magnetic field. A whole body birdcage radio frequency coil (26) excites magnetic resonance in dipoles of the subject. The resonance signals are received by the whole body coil (26) and by a second, local birdcage radio frequency coil (16). The first radio frequency coil (26) produces and is sensitive to a uniform radio frequency field in the imaging region (14) while the second radio frequency coil (28) is sensitive to a field that varies sinusoidally in space. From one radio frequency excitation, the two birdcage coils (26, 16) receive different sets of data with which to fill k-space, accelerating data collection.

23 Claims, 4 Drawing Sheets

BIRDCAGE COILS FOR SIMULTANEOUS ACQUISITION OF SPATIAL HARMONICS

BACKGROUND OF THE INVENTION

The present invention relates to the magnetic resonance imaging arts. It finds particular application in conjunction with accelerating data acquisition when using multiple radio frequency coils and will be described with particular reference thereto. It is to be appreciated, however, that the present invention may also find other applications, and is not limited to the aforementioned application.

In magnetic resonance imaging, a substantially uniform main magnetic field is generated within an examination region. The main magnetic field polarizes the nuclear spin system of a patient being imaged within the examination region. Magnetic resonance is excited in dipoles which align with the main magnetic field by transmitting radio frequency excitation signals into the examination region. Typically, radio frequency pulses transmitted via a whole body radio frequency coil assembly tip the dipoles out of alignment with the main magnetic field and cause a macroscopic magnetic moment vector to precess around an axis parallel to the main magnetic field. The precessing magnetic moment, in turn, generates a corresponding radio frequency magnetic resonance signal as it relaxes and returns to its former state of alignment with the main magnetic field. The resonance signals are received either by the whole body RF coil or by a localized coil, such as a head coil. Magnetic field gradients are applied during this process to encode spatial information in the phase and frequency of the resonance signal. Typically, read gradients cause frequency encoding of each data line along one axis and phase encode gradients step the data lines along an orthogonal data line. An image representation is reconstructed for display on a human viewable display.

In magnetic resonance imaging, relatively large amounts of data are collected when compared to other imaging modalities. For instance, in nuclear imaging, less actual data is typically collected, and large amounts of post-patient processing are performed on the data to generate a quality image. In MRI, large amounts of data are collected, but relatively little processing is performed to produce an image. Typically, a Fourier transform is applied to convert the k-space data from a frequency and phase space matrix into a real space image. Consequently, the patient is present in the scanner for periods of time which can be quite extended, depending on scan parameters, selected sequences, imaged volume, resolution, and other factors.

In an effort to shorten data collection times, a number of data collection sequences have been developed that are faster than spin-echo sequences. Some of these sequences use less than 90° tip angles, in an effort to shorten the decay times of the excited spins. Others take different, non-raster paths through k-space. Several other time saving sequences have been developed to reduce scan times. As side effects of some of these sequences, signal to noise ratios are decreased, data collection is incomplete, or image artifacts are generated. Most sequences that speed the data collection process sacrifice some aspects of the final image.

The present invention contemplates a new and improved method and apparatus that speeds the data collection process without having to sacrifice image quality, overcoming the above referenced disadvantages and others.

SUMMARY OF THE INVENTION

In accordance with one aspect of the present invention, a magnetic resonance apparatus is provided. A main magnet assembly generates a substantially uniform main magnetic field through an imaging region. A gradient coil assembly superimposes gradient fields upon the main magnetic field. A first radio frequency assembly excites and manipulates dipoles in a subject disposed in the imaging region. The assembly receives magnetic resonance signals from the imaging region. The first radio frequency assembly has at least two modes, one mode being tuned to a sinusoid function along one axis to receive a different harmonic of the magnetic resonance signals than another mode of the assembly.

The coils of the radio frequency assembly may take on different geometries like, for example, the form of a planar ladder array or a cylindrical birdcage coil with a circular or elliptical cross section. A single physical coil may, in practice, be used in place of two or all three coils. For example, the imager's body coil may be used in place of the first coil that transmits the radio frequency signals. This same body coil may also be used in place of the uniform receive coil. Alternatively, two separate resonance modes on a single coil structure could act as two of the coils in the above general discussion. For the purposes of this patent, however, we will describe the receive coils as if they are separate coils, knowing that they may not be separate physical coils in practice.

In accordance with another aspect of the present invention, a method of magnetic resonance is provided. A main magnetic field is induced through a region of interest in an imaging region of a magnetic resonance imaging apparatus. The main magnetic field is spatially encoded, and magnetic resonance is induced in selected dipoles in the imaging region. Magnetic resonance signals are received with a first coil structures, the coil having a first mode that receives signals that correspond to a first section of k-space. Magnetic resonance signals that correspond to a second mode corresponding to a second region of k-space are received concurrently. The received magnetic resonance signals are reconstructed into an image representation.

In accordance with another aspect of the present invention, a birdcage coil is provided. A ladder shaped coil array in planar form or shaped into the form of at least part of a cylinder having a region of sensitivity sensitive to an electromagnetic field that varies sinusoidally in a first dimension within the region of sensitivity.

One advantage of the present invention resides in faster data acquisition.

Another advantage of the present invention resides in shorter scan times.

Another advantage resides in increased patient throughput.

Still further advantages of the present invention will become apparent to those of ordinary skill in the art upon reading and understanding the following detailed description of the preferred embodiments.

BRIEF DESCRIPTION OF THE DRAWINGS

The invention may take form in various parts and arrangements of parts. The drawings are only for purposes of illustrating a preferred embodiment and are not to be construed as limiting the invention.

DETAILED DESCRIPTION OF THE PREFERRED EMBODIMENT

Figure 1:
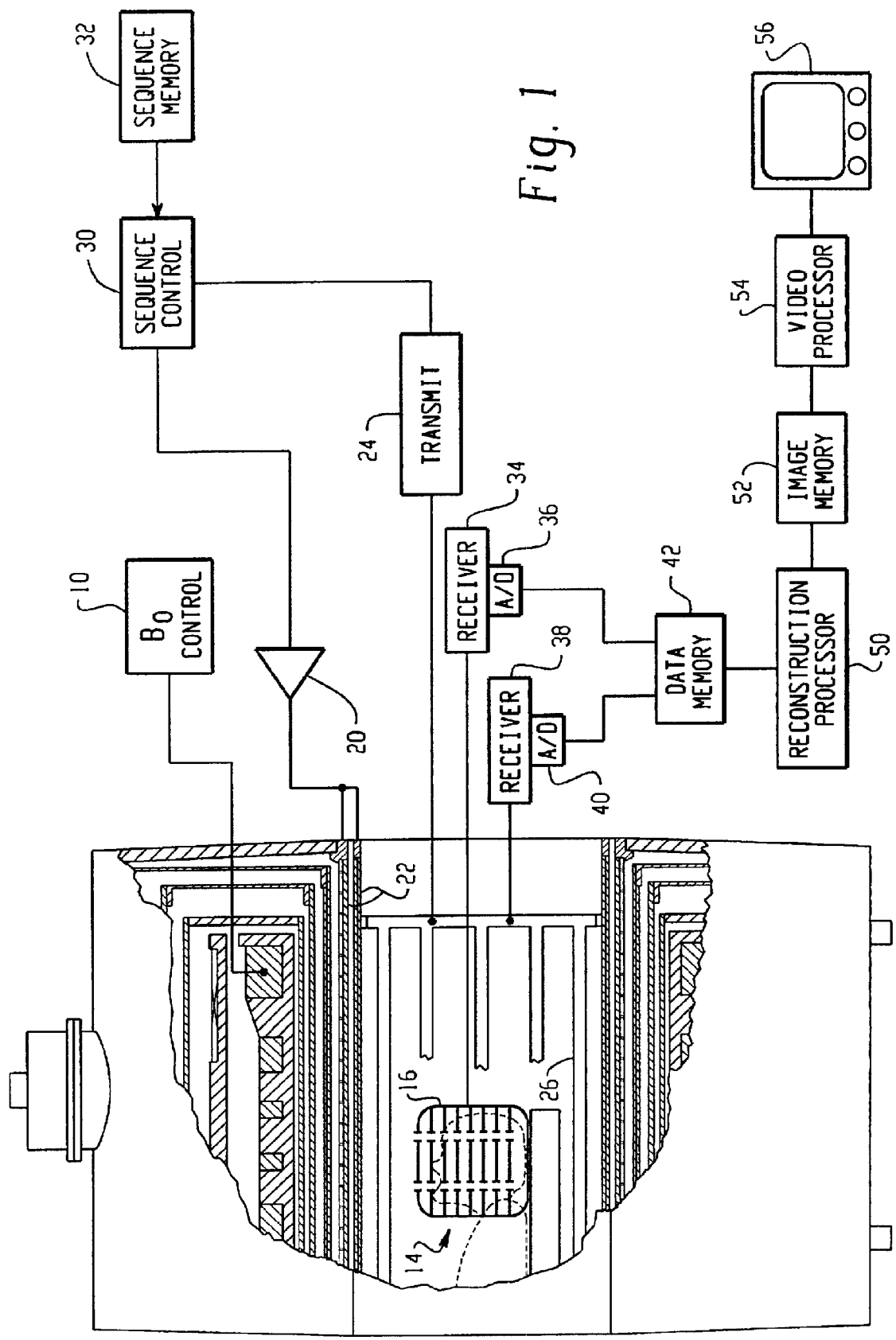
FIG. 1 is a diagrammatic illustration of a magnetic resonance imaging apparatus in accordance with the present invention.

With reference to FIG. 1, a main magnetic field control 10 controls superconducting or resistive magnets 12 such that a substantially uniform, temporally constant main magnetic field is created along a z-axis of an examination region 14 and an axis of one or more birdcage radio frequency (RF) coils 16. A magnetic resonance generation and manipulation system applies a series of radio frequency and magnetic field gradient pulses to invert or excite magnetic spins, induce magnetic resonance, refocus magnetic resonance, manipulate magnetic resonance, spatially and otherwise encode the magnetic resonance, to saturate spin, and the like to generate magnetic resonance imaging and spectroscopy sequences. More specifically, gradient pulse amplifiers 20 apply current pulses to selected whole-body gradient coils 22 to create magnetic field gradients along orthogonal axes of the examination region 14.

A digital radio frequency transmitter 24 transmits radio frequency pulses or pulse packets to a first RF coil 26, which in the preferred embodiment is a whole-body birdcage RF coil, to transmit RF pulses into the examination region. A typical radio frequency pulse is composed of a packet of immediately contiguous pulse segments of short duration which taken together with each other and any applied gradients achieve a selected magnetic resonance manipulation. The RF pulses are used to saturate, excite resonance, invert magnetization, refocus resonance, or manipulate resonance in selected portions of the examination region. The resonance signals are picked up by the whole-body RF coil 26 and the second, local receive coil 16.

Figure 2:
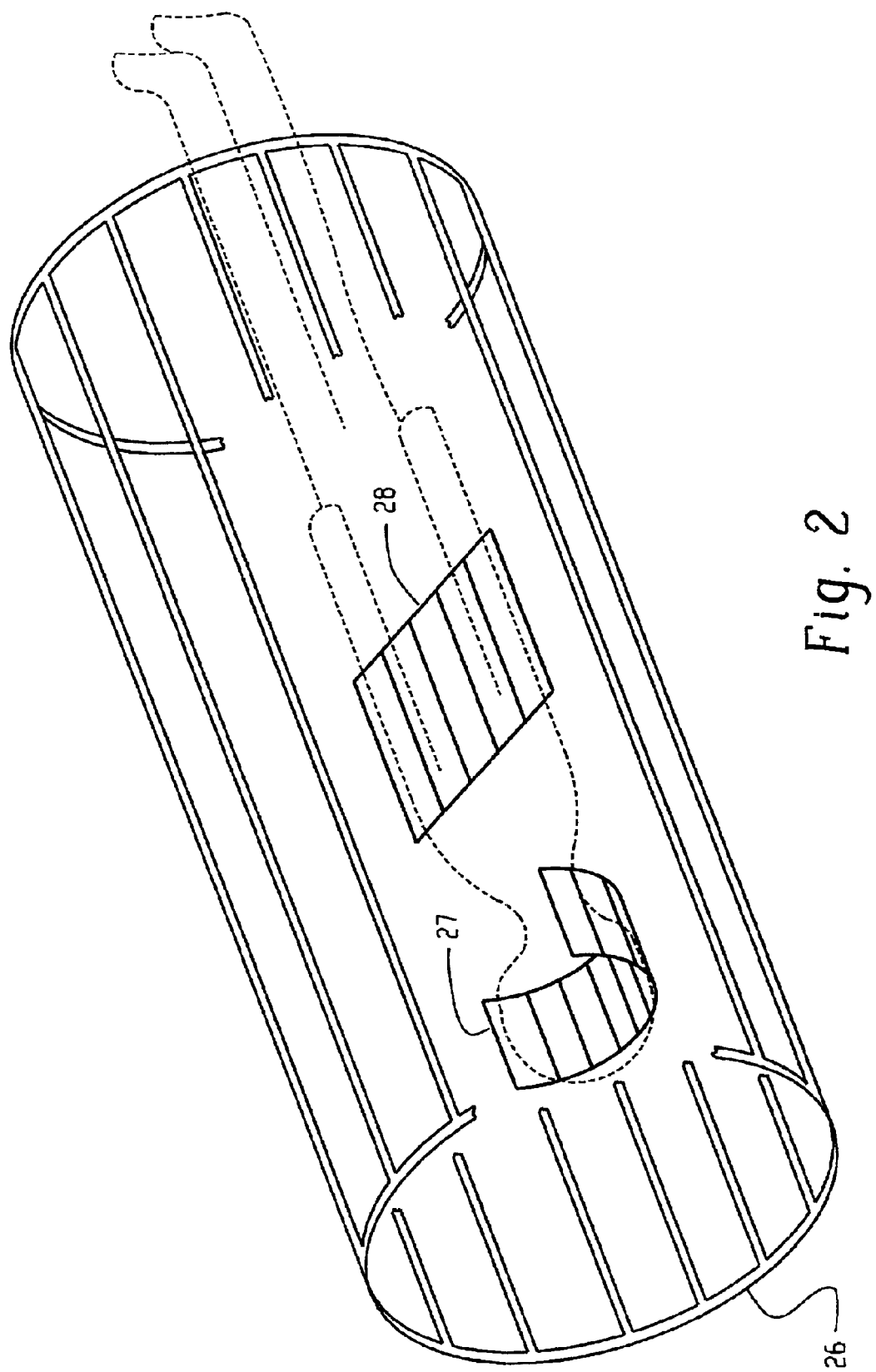
FIG. 2 is a perspective view of a subject disposed in a full body RF coil with a partial birdcage RF coil and a planar ladder array RF coil also illustrated.

In the illustrated embodiment of FIG. 1, a birdcage head coil is depicted. It is to be understood that any local coil structure, examples of which are depicted in FIG. 2, including any full or partial birdcage coil 27 or any planar or curved ladder array 28 can be used. A single physical coil may, in practice, be used in place of two or all three coils. For example, the imager's body coil 26 may be used in place of the first coil that transmits the radio frequency signals. This same body coil 26 may also be used in place of the uniform receive coil 16. Alternatively, two separate resonance modes on a single coil structure could act as two of the coils in the above general discussion. Hereinafter, the RF coils are described as if they are separate coils, but it is to be understood that they may or may not be separate physical coils in practice.

A sequence control circuit 30 withdraws selected sequences from a sequence memory 32 and controls the gradient pulse amplifiers 20 and the transmitter 24 to generate any of a plurality of imaging sequences such as echo planar imaging, echo volume imaging, gradient and spin echo imaging, fast spin echo imaging, and the like. Sequences that produce higher quality images are preferred, but the preferred embodiment is applicable to all sequences that fill in k-space by reading out parallel data lines. For the selected sequence, a first receiver 34 receives magnetic resonance signals from the whole body RF coil 26 and demodulates the signals into a plurality of data lines. If the receiver is analog, an analog-to-digital converter 36 converts each data line to a digital format. Alternately, the analog-to-digital converter is disposed between the radio frequency receiving coil 26 and the receiver 32 for digital receivers.

A second receiver 38 receives magnetic resonance signals from the local receive coil 16 and demodulates the signals into a plurality of data lines. The data lines demodulated by the second receiver 38 are shifted from the data lines demodulated by the first receiver 34, as is discussed in detail below. A second analog to digital converter 40 converts each data line from the second receiver into digital format. Again, the analog to digital converter can be upstream from a digital receiver. Data lines from the two receivers are arranged in their proper order and stored in a data memory 42.

The data lines are reconstructed into an image representation by a reconstruction processor 50 which applies an inverse Fourier transform or other appropriate reconstruction algorithm. The image may represent a planar slice through the patient, an array of parallel planar slices, a three-dimensional volume, or the like. The electronic image representation is then stored in an image memory 52 where it is selectively accessed by a video processor 54 that converts slices, projections, or other portions of the image representation into appropriate format for a display, such as a monitor 56 which provides a human-readable display of the resultant image.

In the preferred embodiment, the whole-body coil 26 transmits RF pulses into the imaging region, and both the whole-body coil 26 and the local coil 16 receive magnetic resonance signals from the same region. Preferably, the whole-body coil 26 produces an RF field in the imaging region 14 that is uniform in all three real space dimensions. The local coil 16 is tuned to an RF field that has one transverse component that varies as:

$$\sin \Delta kx \text{ or } \sin \Delta ky \qquad (1)$$

altering the effective RF field within the coil 16 as sinusoidal in one dimension, where $\Delta k$ is the spatial frequency of the sinusoid and the distance in k-space separating the data acquired by the uniform field coil and the sinusoidal field coil. The other transverse component of the RF field should be $\pi/2$ radians out of phase with the sinusoid (e.g. a cosine). In the preferred embodiment, the local coil is receive only. If used as a transmit coil, the generated RF field would have the sinusoidal dependency along one axis.

Figure 3:
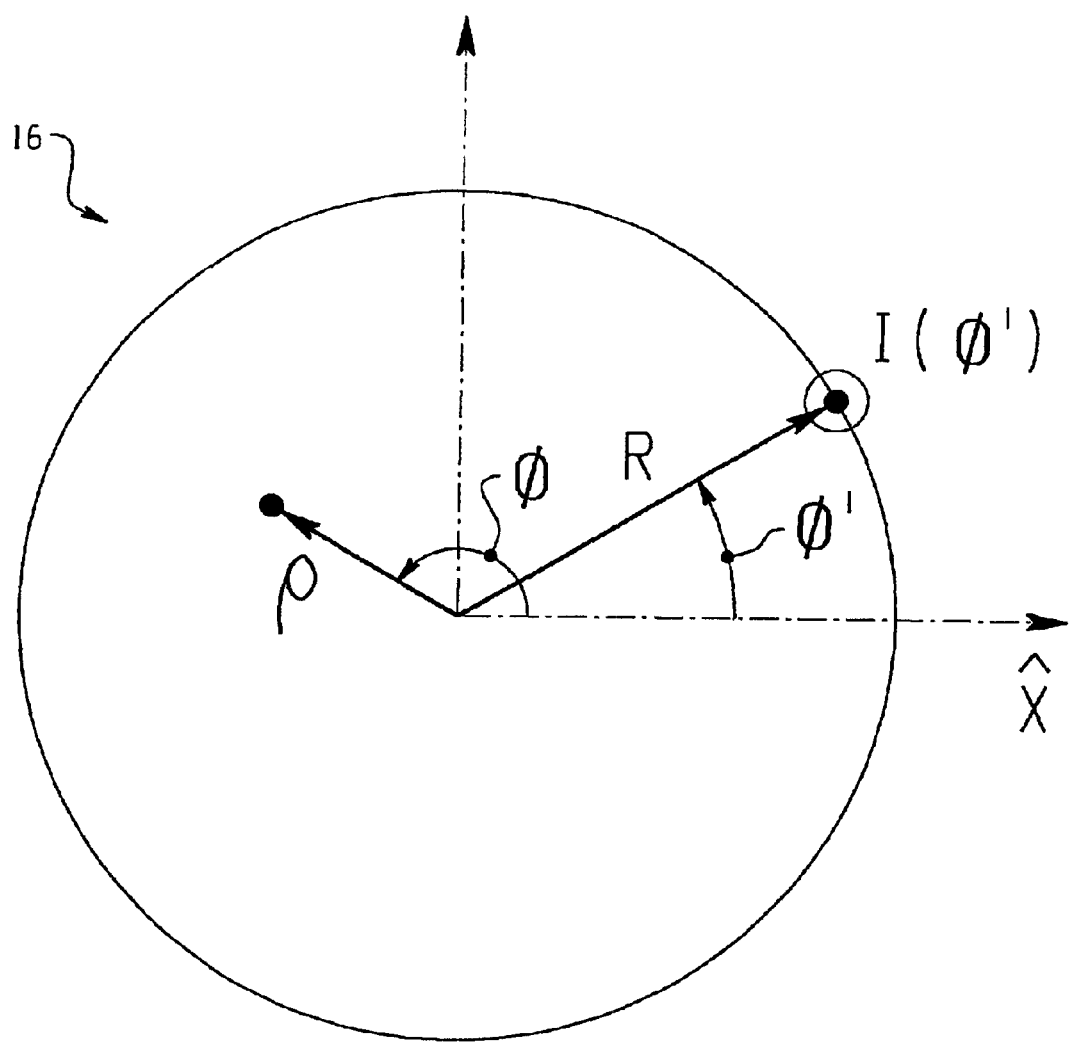
FIG. 3 is a coordinate system based on cylindrical coil geometry.

A birdcage coil includes a plurality of longitudinal current carrying elements or rungs that run parallel to the main magnetic field in a bore type system. In general, the electromagnetic field produced within a hollow cylinder is a function of the current distribution carried along the cylinder. The rungs of a birdcage RF coil approximate the shell of a cylinder, hence, the more current carrying elements there are, the better approximation the coil is to an actual cylinder. The magnetic field produced at an arbitrary point within a long cylinder carrying current in the z-direction has a component in the x-direction is given by:

$$B_x(\rho, \phi) = -\frac{\mu_0 R}{2\pi} \int_0^{2\pi} \frac{K(\phi')(\rho \sin(\phi) - R\sin(\phi'))}{\rho^2 + R^2 - 2\rho R \cos(\phi - \phi')} d\phi' \qquad (2)$$

and similarly, a component in the y-direction given by:

$$B_y(\rho, \phi) = \frac{\mu_0 R}{2\pi} \int_0^{2\pi} \frac{K(\phi')(\rho\cos(\phi) - R\cos(\phi'))}{\rho^2 + R^2 - 2\rho R\cos(\phi - \phi')} d\phi' \quad (3)$$

where ρ and φ designate the point in cylindrical coordinates and K(φ') is the current distribution on the cylinder, R being the radius of the cylinder, and φ' being the angle to an arbitrary current carrying element on the cylinder as can be seen in FIG. 3. For a birdcage coil, φ' is discretized. That is, there are discrete paths current can take along the surface of the coil. By knowing the surface current to field relationship, any arbitrary field can be produced within the coil by adjusting the current distribution K(φ').

If the surface current is assumed to be of the form:

$$K_n(\phi') = \sin(n\phi') \quad (4)$$

and the integrals $$\int_0^{2\pi} \frac{\sin(m\phi')}{\rho^2 + R^2 - 2\rho R\cos(\phi - \phi')} d\phi' = \frac{2\pi}{R^2 - \rho^2}\left(\frac{\rho}{R}\right)^m \sin(m\phi) \quad (5)$$

$$\int_0^{2\pi} \frac{\cos(m\phi')}{\rho^2 + R^2 - 2\rho R\cos(\phi - \phi')} d\phi' = \frac{2\pi}{R^2 - \rho^2}\left(\frac{\rho}{R}\right)^m \cos(m\phi)$$

are used, then the field inside a long cylinder with a sin (nφ') current distribution on its surface can be written as:

$$B_x^n = \frac{\mu_0}{2}\left(\frac{\rho}{R}\right)^{n-1} \cos[(n-1)\phi] \quad (6)$$

$$B_y^n = -\frac{\mu_0}{2}\left(\frac{\rho}{R}\right)^{n-1} \sin[(n-1)\phi] \quad (7)$$

In complex notation, $\hat{B} = B_x - iB_y$, and by combining equations (6) and (7), the field becomes:

$$\hat{B}_n(\rho, \phi) = \frac{\mu_0}{2}\left(\frac{\rho e^{i\phi}}{R}\right)^{n-1} \quad (8)$$

for a long cylinder. Converting Cartesian coordinates into cylindrical coordinates, x becomes ρ cos φ and y becomes ρ sin (φ). The field at φ=0 and φ=π/2 becomes:

$$\hat{B}_n(\rho = x, \phi = 0) = \frac{\mu_0}{2}\left(\frac{x}{R}\right)^{n-1} \quad (9)$$

$$\hat{B}_n\left(\rho = y, \phi = \frac{\pi}{2}\right) = \frac{\mu_0}{2}\left(\frac{iy}{R}\right)^{n-1} \quad (10)$$

The power law dependence of the magnetic field shows that a series of terms of different orders n can be constructed to mimic any desired behavior of the magnetic field B(x,y). That is, the fields $B_n$ act as basis functions for the representation of the field behavior along (φ=0 and (φ=π/2. The current basis functions $K_n$ are the sources of the field basis functions.

$$K^{tot} = \sum_n a_n K_n, \hat{B}^{tot} = \sum_n a_n \hat{B}_n \quad (11)$$

The coefficient an can be chosen to shape the field as desired, that is, it controls the current function K(φ'). Here, this method of achieving a specific field shape is applied to design RF coils for one parallel MR imaging application.

The same design concept, that is, using a set of specified current basis functions and identifying the corresponding field shape basis functions and weighting them appropriately in a sum, can be used with any geometry to design arbitrary field shapes for any application involving fields and sources, in MRI or otherwise. For example, the field shapes of RF coils could be optimized for other implementations of parallel MRI where different field shapes are desired.

By altering the effective field inside an RF receive coil, the coil becomes sensitive to different resonance signals. In the preferred embodiment, the whole body coil 26 and the local coil 16 are tuned to different harmonics of the resonating dipoles. The whole body coil 26 induces and is sensitive to a constant field sensitive to a base harmonic (m=0), and the local coil 16 is sensitive to a sinusoidally varying field, sensitizing the coil to an upper harmonic of the resonating dipoles. A unique sinusoidal field is associated with each harmonic m of the resonance signals:

$$B(x, y) = ce^{im\frac{2\pi}{L}x} \quad (12)$$

where L is the field of view in the direction of the sinusoid (x in this case), and c is preferably a constant. Setting m=0, the field is c that is, constant. This field is produced by the whole body coil 26.

The relationship between the current distribution and the magnetic field profile is known. The relationship between the magnetic field profile an the harmonic is known. It is then straight forward to calculate the current distribution that produces a given harmonic.

It should be noted that to generate a sinusoid (or equivalently, a complex sinusoid) in one direction, a hyperbolic sinusoid (a real exponential) is generated in the orthogonal direction. In the example of a static field in free space, $\vec{\nabla} \cdot \vec{B} = 0$ implies that the magnetic field can be written as a scalar potential. $\vec{B} = -\vec{\nabla}\Phi$ and $\vec{\nabla} \cdot \vec{B} = 0$ imply that this scalar potential satisfies Laplace's equation, $\nabla^2 \Phi = 0$. Writing the scalar potential, using separation of variables, as Φ(x,y)=f(y)g(x) Laplace's equation becomes:

$$f''(y)g(x) + f(y)g''(x) = 0. \quad (13)$$

If one of the functions (f or g) is chosen to be sinusoidal, for example $g(x) = e^{\pm ikx}$, then the differential equation for g is as follows:

$$g''(x) = -k^2 g(x) \quad (14)$$

and from equation (13), the differential equation for f becomes:

$$f''(y) = k^2 f(y). \quad (15)$$

By solving equation (15), it can be found that $f(y) = e^{\pm ky}$. Therefore, if the functional behavior in one direction is sinusoidal, then the behavior in an orthogonal direction is exponential, that is, a hyperbolic sinusoid.

$$\Phi(x, y) = e^{\pm ky} e^{\pm ikx} \quad (16)$$

It can be seen that the price of a complex exponential in one dimension is a decay in an orthogonal dimension. This type of behavior also holds of the vector field and stems from Maxwell's equations.

Different harmonics have different exponential falloff corresponding to a filtering of the k-space data. In the preferred embodiment, two harmonics are collected. It is to be understood that additional, theoretically unlimited harmonics can be collected each by a correspondingly tuned coil. The number of coils is limited by practical restrictions.

Figure 4:
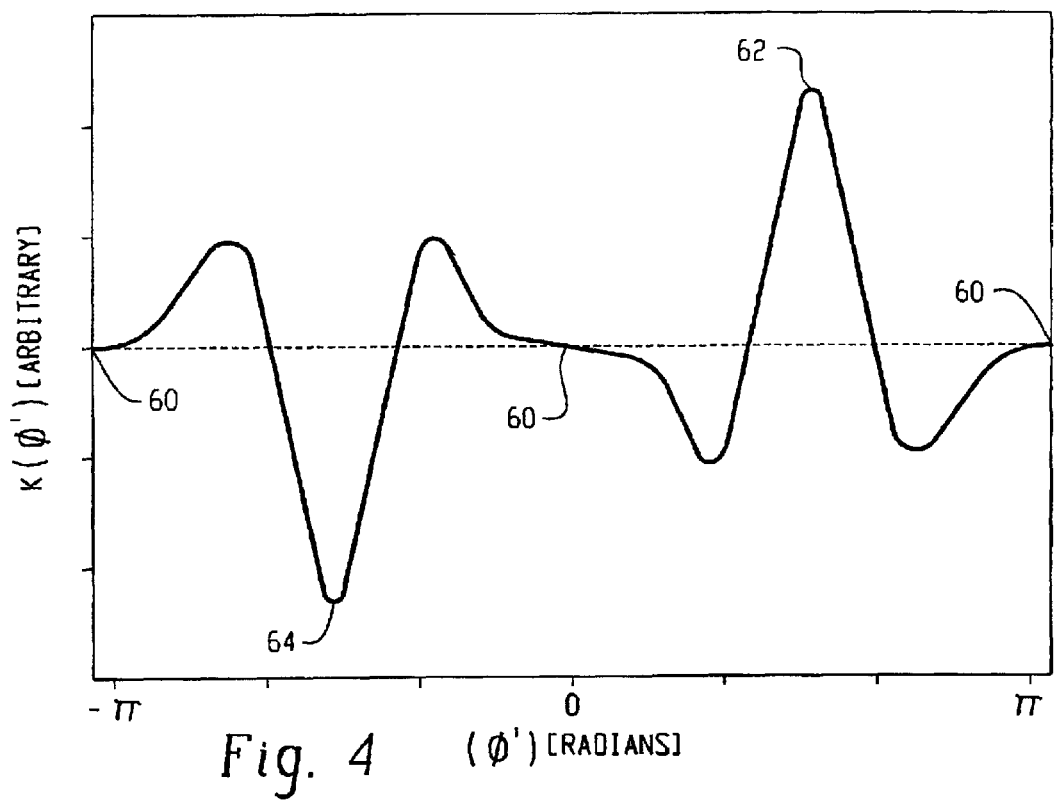
FIG. 4 is a current distribution vs. circumferential position plot for a birdcage coil in accordance with the present invention.

An exemplary embodiment of the local birdcage coil 16 has 24 longitudinal current carrying elements, a radius (R) of 15 cm, a length (L) of 30 cm, and is tuned to the first harmonic (m=1). Each rung of the birdcage, that is, each longitudinal element carries a current. With reference to FIG. 4, a surface current distribution K as a function of the angle $\phi'$ for the sinusoidal dependence is shown. The illustrated current distribution yields a magnetic field inside the coil that varies as a cosine function in the x-direction. The value of the current is arbitrary, as it is the distribution $K(\phi')$ that affects the shape of the field inside the coil. The magnitude of the current affects the induced field strength. Preferably, no current flows at points 60, which points correspond to $\phi'=0$, and $\phi'=\pi$ (or $-\pi$) on the local birdcage coil 16. Current flow maxima occur at points 62 and 64 which correspond to $\phi'=\pi/2$ and $\phi'=-\pi/2$, respectively. The current flow at 64 is preferably equal and opposite to the current flow at 62. The illustrated current distribution $K(\phi')$ produces a field that is sinusoidal in one dimension. The reactance along each element is adjusted to produce the relative current at the resonance frequency shown in the curve of FIG. 4 as the angular location of the element. Preferably, the current distribution is designed to shift the resultant data line one step in k-space. However, larger steps are contemplated. For example, if two localized coils are tuned to shift the data lines over one third and two thirds of k-space, the coil that shifts the data lines by one third of k-space (preferably the closest) can be utilized to collect the center lines of k-space and the two further coils can collect the data at the edges of k-space. Numerous other strategies will be apparent to those of ordinary skill in the art.

It is to be understood that potentially any field profile can be produced within the coil by varying the current distribution carried by the surface. Higher harmonics can be collected by varying the wavelength of the induced sinusoidal field. Also, other non-sinusoidal fields have been contemplated.

Birdcage coils have two end ring conductors, which are disposed in a parallel and spaced-apart relation. The end ring conductors are interconnected by the rungs of the birdcage. In an embodiment employing 24 current carrying elements each adjacent pair of rungs subtends an angle of 15 degrees on each end ring conductor. Alternate embodiments may use irregularly spaced rungs connecting the end rings. The placement of these rungs may be optimized for producing the most accurate discretized representation of the desired continuous current density. The number and position of the rungs can be adjusted using a number of strategies that will be apparent to those of ordinary skill in the art.

The end ring conductors and rungs of the birdcage coils are preferably copper foil strips. These copper strips are fastened to a support structure in a configuration corresponding to the preferred birdcage coil.

To avoid local heating on the end rings, capacitors are added to the end ring conductors. The birdcage coils include at least one capacitor between each adjacent pair of rungs on each end ring conductor. Preferably, each capacitor is a combination of capacitors. Alternatively, local heating is reduced by adding more rungs to the RF coil. The addition of more rungs has the added benefit of improved homogeneity along the axis perpendicular to the coil axis.

RF birdcage transmitter coils generate RF signals near 64 MHZ in a 1.5 Tesla magnetic field for hydrogen dipoles. To assist in generating the preferred $K(\phi')$ current distribution function, capacitors are added to interrupt the rungs of the birdcage coils in order to reduce voltage on the coils. In the preferred embodiment, each rung is interrupted by at least two symmetrically disposed capacitors. It is to be appreciated that greater or fewer than two capacitors may be connected to interrupt each leg conductor. The capacitive values are selected to vary the current that flows in each rung in accordance with the $K(\phi')$ current distribution function.

Figure 5:
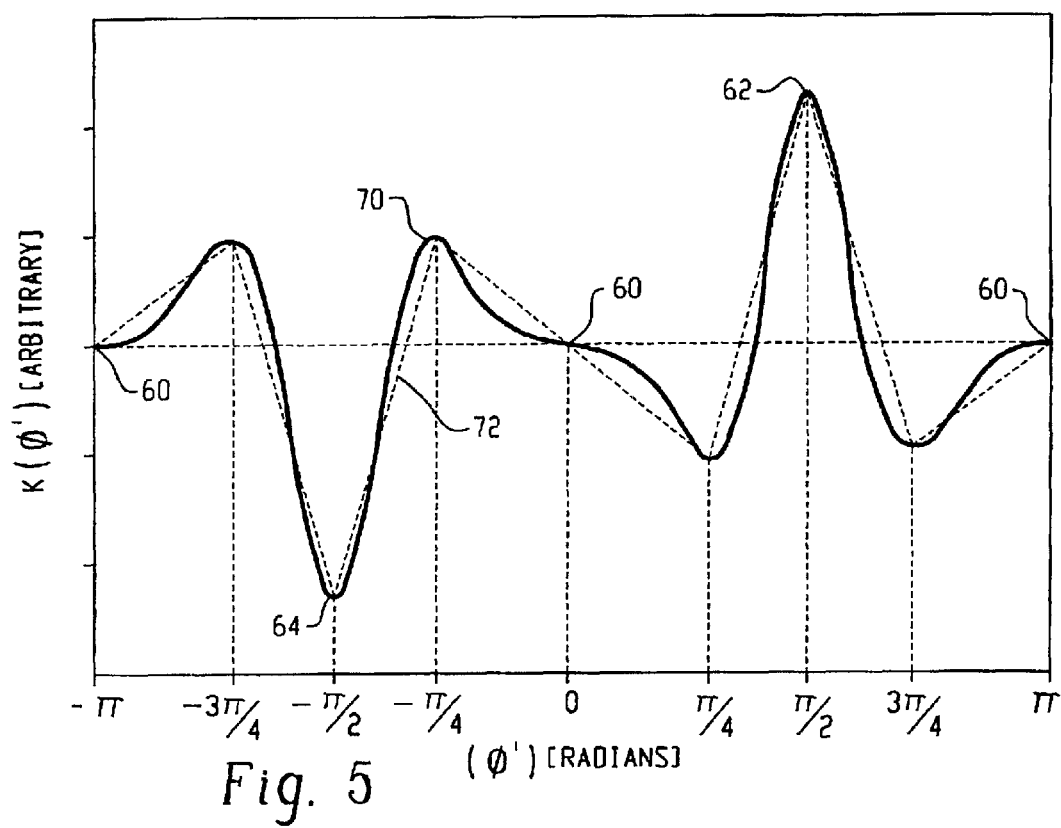
FIG. 5 is a current distribution plot illustrating a current distribution function of a tailored coil.

In an alternate embodiment, a birdcage coil is specifically constructed for a certain harmonic. The coil has as many longitudinal current carrying elements as there are local maxima and minima in the $K(\phi')$ function. With reference to FIG. 5, a birdcage coil constructed solely for carrying the illustrated function 70 has six current carrying elements located at $-3\pi/4$, $-\pi/2$, $-\pi/4$, $\pi/4$, $\pi/2$, and $3\pi/4$. This type of specialized coil does not have enough rungs to adequately represent most other functions, but is sufficient for the function for which it is tailored. The above-described coil produces a current distribution function $K(\phi')$ as ghosted 72 in FIG. 5.

In an alternate embodiment, a half-birdcage embodiment is contemplated. A similar current distribution to the full birdcage embodiment is used, with $\phi'$ only ranging from 0 to $\pi$ rather than from $-\pi$ to $\pi$. The preferred half-birdcage embodiment includes thirteen longitudinal current carrying elements in the range of $0<\phi'<\pi$. Additionally, elliptical birdcages can be utilized, with slightly different surface current distributions.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A magnetic resonance apparatus comprising:
   a main magnet assembly for generating a substantially uniform main magnetic field through an imaging region;
   a gradient coil assembly for superimposing gradient magnetic fields upon the main magnetic field, the gradient magnetic fields spatially encoding the main magnetic field;
   a first radio frequency assembly for exciting and manipulating dipoles in a subject disposed in the imaging region, and for receiving magnetic resonance signals therefrom, the first radio frequency assembly having at least two modes, one mode being tuned to a sinusoid function along a linear axis transverse to the main magnetic field to receive concurrently a different harmonic of the magnetic resonance signal than another mode of the assembly, such that two regions of k-space are sampled concurrently.

2. The magnetic resonance apparatus as set forth in claim 1, wherein the first radio frequency assembly includes a first whole body birdcage coil.

3. The magnetic resonance apparatus as set forth in claim 2, further including:
   a second birdcage coil that is a local birdcage coil.

4. The magnetic resonance apparatus as set forth in claim 3, wherein the first and second birdcage coils receive magnetic resonance signal from the same region of interest within the subject.

5. The magnetic resonance apparatus as set forth in claim 3, wherein the first birdcage coil induces a uniform magnetic field.

6. The magnetic resonance apparatus as set forth in claim 3, further including:
a third birdcage coil that receives data that fills in a portion of the k-space different from the portions of k-space filled in by data from the first and second birdcage coils, and wherein the third birdcage coil is magnetically decoupled from the first and second birdcage coils.

7. The magnetic resonance apparatus as set forth in claim 3, wherein the first and second birdcage coils are magnetically decoupled from one other.

8. The magnetic resonance apparatus as set forth in claim 3, wherein at least the second birdcage coil includes:
first and second end rings connected by a plurality of current carrying rungs, wherein each rung is interrupted by a capacitance, the capacitances being selected to define a current distribution function through the rungs that produce a magnetic field with one component which is sinusoidal along one axis and hyperbolically sinusoidal along an orthogonal axis.

9. The magnetic resonance apparatus as set forth in claim 3, wherein the second birdcage coil is sensitive to an effective magnetic field B whose x and y components are defined by $$B_x(\rho, \phi) = -\frac{\mu_0 R}{2\pi} \int_0^{2\pi} \frac{K(\phi')(\rho\sin(\phi) - R\sin(\phi'))}{\rho^2 + R^2 - 2\rho R\cos(\phi - \phi')} d\phi'$$

the x-direction and by $$B_y(\rho, \phi) = \frac{\mu_0 R}{2\pi} \int_0^{2\pi} \frac{K(\phi')(\rho\cos(\phi) - R\cos(\phi'))}{\rho^2 + R^2 - 2\rho R\cos(\phi - \phi')} d\phi'$$

in the y-direction, where $\rho$ and $\phi$ designate the point in cylindrical coordinates and $K(\phi')$ is the current distribution mimicked by the discretized current carried by the rungs of the birdcage, R being the radius of the birdcage, and $\phi'$ being the angle to an arbitrary current carrying element on the surface of the birdcage.

10. A magnetic resonance apparatus comprising:
a main magnet assembly for generating a temporally constant main magnetic field through an imaging region:
a gradient coil assembly for superimposing gradient magnetic fields upon the main magnetic field for spatially encoding the main magnetic field;
a first, whole body birdcage radio frequency coil for exciting and manipulating dipoles in a subject disposed in the imagine region, and for receiving magnetic resonance signals therefrom, the first radio frequency assembly having at least two modes, one mode being tuned to a sinusoid function along one axis to receive a different harmonic of the magnetic resonance signals than another mode of the assembly;
a second birdcage coil that, simultaneously with the first birdcage coil, receives sets of data that fill different portions of a k-space matrix than data from the first birdcage coil fills.

11. A magnetic resonance apparatus comprising:
a main magnet assembly for generating a substantially uniform main magnetic field through an imaging region;
a gradient coil assembly for superimposing gradient magnetic fields upon the main magnetic field:
a first, whole body birdcage radio frequency coil for exciting and manipulating dipoles in a subject disposed in the imaging region, and for receiving magnetic resonance signals therefrom, the first radio frequency assembly having at least two modes, one mode being tuned to a sinusoid function alone one axis to receive a different harmonic of the magnetic resonance signals than another mode of the assembly;
a second birdcage coil that includes a mode of sensitivity sensitive to a first harmonic of the magnetic resonance signals.

12. A method of magnetic resonance comprising:
inducing a main magnetic field through a region of interest disposed in an imaging region of a magnetic resonance apparatus;
spatially encoding the main magnetic field with gradient fields;
inducing magnetic resonance in selected dipoles within the region of interest;
receiving magnetic resonance signals with a first radio frequency coil, the signals having a first mode corresponding to a first section of a k-space;
concurrently receiving magnetic resonance signals of a second mode different than the first mode, the signals corresponding to a second section of k-space different than the first section;
reconstructing the received magnetic resonance signals into an image representation of the region of interest.

13. The method as set forth in claim 12, wherein the step of receiving includes receiving magnetic resonance signals with a first birdcage coil, and wherein the step of concurrently receiving includes receiving magnetic resonance signal with a second birdcage coil.

14. The method as set forth in claim 13, further including:
generating a uniform electromagnetic field with the first birdcage coil, sensitizing the first birdcage coil to the first section of k-space.

15. The method as set forth in claim 13, further including:
generating an electromagnetic field that varies sinusoidally in one dimension with the second birdcage coil, sensitizing the second birdcage coil to the second section of k-space.

16. The method as set forth in claim 13, wherein the first and second birdcage coils are sensitive to a same region of real space.

17. The method as set forth in claim 13, wherein the first and second birdcage coils are magnetically decoupled from each other.

18. The method as set forth in claim 13, wherein at least one of the receiving steps includes receiving magnetic resonance signals corresponding to an effective magnetic field B whose x and y components are defined by $$B_x(\rho, \phi) = -\frac{\mu_0 R}{2\pi} \int_0^{2\pi} \frac{K(\phi')(\rho\sin(\phi) - R\sin(\phi'))}{\rho^2 + R^2 - 2\rho R\cos(\phi - \phi')} d\phi'$$

in the x-direction and by $$B_y(\rho, \phi) = \frac{\mu_0 R}{2\pi} \int_0^{2\pi} \frac{K(\phi')(\rho\cos(\phi) - R\cos(\phi'))}{\rho^2 + R^2 - 2\rho R\cos(\phi - \phi')} d\phi'$$

in the y-direction, where $\rho$ and $\phi$ designate the point in cylindrical coordinates and $K(\phi')$ is the current distribution carried by the rungs of the birdcage, R being the radius of the birdcage, and $\phi'$ being the angle to an arbitrary current carrying element on the surface of the birdcage.

19. A method of magnetic resonance comprising:
inducing a main magnetic field through a region of interest disposed in an imaging region of a magnetic resonance apparatus;
spatially encoding the main magnetic field with gradient fields;
inducing magnetic resonance in selected dipoles within the region of interest;
receiving magnetic resonance signals with a first birdcage coil, the signals having a first mode corresponding to a first section of a k-space;
with a second birdcage coil, concurrently receiving magnetic resonance signals of a second mode different than the first mode, the signals corresponding to a second section of k-space different than the first section, one transverse component of the second magnetic resonance mode of the second birdcage coil along an x-axis varying by:

$$\sin \Delta kx$$

from static electromagnetic field of the first birdcage coil, where $\Delta k$ is a constant, and a second transverse component varying by $\pi/2$ radians; and,
reconstructing the received magnetic resonance signals into an image representation of the region of interest.

20. A removable coil, which is removably mounted into a magnetic resonance scanner which has a built-in resonance coil to receive a resonance signal, the removable birdcage coil comprising:
a radio frequency element that includes a ladder element shaped into at least a portion of one of a cylindrical section and a plane, rungs of the ladder element forming longitudinal elements of the coil;
a region of sensitivity within the cylinder portion, the radio frequency element being tuned to receive a harmonic of the resonance signal, which harmonic is different from the first harmonic such that the removable and built-in coils receive data from shifted portions of k-space.

21. The coil as set forth in claim 20, wherein the birdcage coil is sensitive to an effective magnetic field B whose x and y components are defined by $$B_x(\rho, \phi) = -\frac{\mu_0 R}{2\pi} \int_0^{2\pi} \frac{K(\phi')(\rho\sin(\phi) - R\sin(\phi'))}{\rho^2 + R^2 - 2\rho R\cos(\phi - \phi')} d\phi'$$

in the x-direction and by $$B_y(\rho, \phi) = \frac{\mu_0 R}{2\pi} \int_0^{2\pi} \frac{K(\phi')(\rho\cos(\phi) - R\cos(\phi'))}{\rho^2 + R^2 - 2\rho R\cos(\phi - \phi')} d\phi'$$

in the y-direction, where $\rho$ and $\phi$ designate the point in cylindrical coordinates and $K(\phi')$ is the current distribution carried by the rungs of the birdcage, R being the radius of the birdcage, and $\phi'$ being the angle to an arbitrary current carrying element on the surface of the birdcage.

22. A local birdcage coil located within a whole body birdcage coil, the local birdcage coil comprising:
a radio frequency element that includes two end rings and multiple rungs interrupted by capacitors, which define a ladder element shaped into at least a portion of a cylindrical section;
a region of sensitivity within the cylindrical section portion, the radio frequency element being sensitive to an electromagnetic field that varies sinusoidally according to $$\sin \Delta kd$$

within the region of sensitivity.

23. A coil comprising:
a radio frequency element that includes spaced longitudinal elements that define ladder element, the ladder element being shaped into at least a portion of one of a cylindrical section and a plane;
a region of sensitivity within the cylinder portion, the radio frequency element being sensitive to an electromagnetic field that varies:
sinusoidally in a first dimension within the region of sensitivity and
hyperbolically sinusoidally in a second dimension transverse to the first dimension.

* * * * *